(12) United States Patent
Kim et al.

(10) Patent No.: US 7,675,137 B2
(45) Date of Patent: Mar. 9, 2010

(54) ELECTRICAL FUSE HAVING SUBLITHOGRAPHIC CAVITIES THEREUPON

(75) Inventors: Deok-kee Kim, Bedford Hills, NY (US); Wai-Kin Li, Beacon, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 271 days.

(21) Appl. No.: 11/828,718

(22) Filed: Jul. 26, 2007

(65) Prior Publication Data

US 2009/0026574 A1 Jan. 29, 2009

(51) Int. Cl.
*H01L 29/93* (2006.01)
(52) U.S. Cl. .................. 257/529; 257/530
(58) Field of Classification Search .......... 257/529, 257/530

See application file for complete search history.

(56) References Cited

U.S. PATENT DOCUMENTS

| | | | |
|---|---|---|---|
| 4,796,075 | A | 1/1989 | Whitten |
| 5,428,267 | A | 6/1995 | Peil |
| 5,903,041 | A | 5/1999 | La Fleur et al. |
| 6,137,238 | A | 10/2000 | Alvarez et al. |
| 6,141,245 | A | 10/2000 | Bertin et al. |
| 6,219,215 | B1 | 4/2001 | Bertin et al. |
| 6,633,055 | B2 | 10/2003 | Bertin et al. |
| 6,687,110 | B2 | 2/2004 | Murray |
| 6,924,185 | B2 | 8/2005 | Anderson et al. |
| 6,927,472 | B2 | 8/2005 | Anderson et al. |
| 2002/0011645 | A1 | 1/2002 | Bertin et al. |
| 2003/0089962 | A1 | 5/2003 | Anderson et al. |
| 2003/0178693 | A1 | 9/2003 | Bhattacharyya et al. |

(Continued)

FOREIGN PATENT DOCUMENTS

EP 0744100 11/1996

(Continued)

OTHER PUBLICATIONS

U.S. Appl. No. 11/424,963, First Named Inventor: Haining Yang, Title: Sub-Lithorgraphic Feature Patterning Using Self-Aligned Self-Assembly Polymers, Filing Date: Jun. 19, 2006.

(Continued)

*Primary Examiner*—Douglas M Menz
(74) *Attorney, Agent, or Firm*—Scully, Scott, Murphy & Presser, P.C.; Yuanmin Cai

(57) ABSTRACT

An electrical fuse and a first dielectric layer thereupon are formed on a semiconductor substrate. Self-assembling block copolymers containing two or more different polymeric block components are applied into a recessed region surrounded by a dielectric template layer. The self-assembling block copolymers are then annealed to form a pattern of multiple circles having a sublithographic diameter. The pattern of multiple circles is transferred into the first dielectric layer by a reactive ion etch, wherein the portion of the first dielectric layer above the fuselink has a honeycomb pattern comprising multiple circular cylindrical holes. A second dielectric layer is formed over the circular cylindrical holes by a non-conformal chemical vapor deposition and sublithographic cavities are formed on the fuselink. The sublithographic cavities provide enhanced thermal insulation relative to dielectric materials to the fuselink so that the electrical fuse may be programmed with less programming current.

13 Claims, 10 Drawing Sheets

U.S. PATENT DOCUMENTS

| | | |
|---|---|---|
| 2004/0070049 A1 | 4/2004 | Anderson et al. |
| 2005/0023638 A1 | 2/2005 | Bhattacharyya et al. |
| 2006/0083031 A1 | 4/2006 | Cook, III |

FOREIGN PATENT DOCUMENTS

| | | |
|---|---|---|
| EP | 1012611 | 6/2000 |
| EP | 1329733 | 7/2003 |
| WO | WO2005086196 | 9/2005 |

OTHER PUBLICATIONS

Nealey, Paul F., et al., "Self-assembling resists for nanolithography", IEEE, Dec. 2005, 4 pages.

ELECTRICAL FUSE HAVING SUBLITHOGRAPHIC CAVITIES THEREUPON

FIELD OF THE INVENTION

The present invention relates to semiconductor structures, and particularly to an electrical fuse having sublithographic cavities upon a fuselink portion thereof and methods of manufacturing the same.

BACKGROUND OF THE INVENTION

Electrical fuses (eFuses) are used in the semiconductor industry to implement array redundancy, field programmable arrays, analog component trimming circuits, and chip identification circuits. Once programmed, the programmed state of an electrical fuse does not revert to the original state on its own, that is, the programmed state of the fuse is not reversible. For this reason, electrical fuses are called One-Time-Programmable (OTP) memory elements.

The mechanism for programming an electrical fuse is electromigration of a metal semiconductor alloy induced by an applied electrical field and a raised temperature on a portion of the electrical fuse structure. The metal semiconductor alloy is electromigrated under these conditions from the portion of the electrical fuse structure, thereby increasing the resistance of the electrical fuse structure. The rate and extent of electromigration during programming of an electrical fuse is dependent on the temperature and the current density at the electromigrated portion.

An electrical fuse typically comprises an anode, a cathode, and a fuselink. The fuselink is a narrow strip of a conductive material adjoining the anode and cathode. During programming of the electrical fuse, a positive voltage bias is applied to the anode and a negative voltage bias is applied to the cathode. As electrical current flows through the fuselink having a narrow cross-sectional area, the temperature of the fuselink is elevated. A high current density combined with the elevated temperature at the fuselink facilitates electromigration of the conductive material, which may comprise a metal silicide.

In general, the higher the temperature of the fuselink, the easier it is to electromigrate the conductive material, i.e., the less current is needed to induce electromigration. Since programming of electrical fuses typically takes a substantial amount of current, for example, a programming current of about 5 mA for an electrical fuse having a fuselink width of about 63 nm, it is advantageous to provide effective thermal isolation to the fuselink to keep the temperature of the fuselink elevated during the programming.

While fuselinks of conventional electrical fuses are insulated by dielectric materials so that heat loss from the fuselink is contained during programming of the electrical fuse, improved thermal isolation of the fuselink and a higher temperature during programming would reduce the amount of electrical current needed for programming the electrical fuse. Such a reduction in the electrical current needed for programming would allow reduction of the size of a programming transistor.

In view of the above, there exists a need for an electrical fuse structure having improved thermal isolation around a fuselink, and consequently requiring less programming current, and methods of manufacturing the same.

SUMMARY OF THE INVENTION

The present invention addresses the needs described above by providing an electrical fuse having sublithographic cavities on a fuselink, wherein the sublithographic cavities provide enhanced thermal isolation of the fuselink compared with dielectric materials, and methods of manufacturing the same.

An electrical fuse is formed on a semiconductor substrate and a first dielectric layer is formed over the electrical fuse. A dielectric template layer is formed and patterned to form a recessed region over a fuselink of the electrical fuse. Self-assembling block copolymers containing two or more different polymeric block components that are immiscible with one another are applied into a recessed region surrounded by the dielectric template layer. The self-assembling block copolymers are then annealed to form a pattern of multiple circles having a sublithographic diameter. The pattern of multiple circles is transferred into the first dielectric layer by a reactive ion etch, wherein the portion of the first dielectric layer above the fuselink has a honeycomb pattern comprising multiple circular cylindrical holes. A second dielectric layer is formed over the circular cylindrical holes by a non-conformal chemical vapor deposition and sublithographic cavities are formed on the fuselink. The sublithographic cavities provide enhanced thermal insulation relative to dielectric materials to the fuselink so that the electrical fuse may be programmed with less programming current.

According to an aspect of the present invention, a semiconductor structure is provided, which comprises:

an electrical fuse comprising a first electrode, a second electrode, and a fuselink, and located on shallow trench isolation in a semiconductor substrate, wherein each of the first electrode, the second electrode, and the fuselink comprises a conductive material; and a plurality of cylindrical cavities located above the fuselink.

According to one embodiment, the plurality of cylindrical cavities has a sublithographic diameter, and is separated from the fuselink by a sublithographic dimension.

According to another embodiment, the semiconductor structure comprises a dielectric spacer abutting outer sidewalls of the first electrode, the second electrode, and the fuselink, wherein the plurality of cylindrical holes are located above the dielectric spacer and the shallow trench isolation.

According to even another embodiment, the plurality of cylindrical cavities is separated from the dielectric spacer and the shallow trench isolation by the sublithographic dimension.

According to yet another embodiment, each of the plurality of cylindrical cavities has a cylindrical conical top portion.

According to still another embodiment, the plurality of cylindrical cavities is separated from one another by a first dielectric layer having holes arranged in a honeycomb pattern, wherein the plurality of cylindrical cavities is located within the holes.

According to still yet another embodiment, the semiconductor structure comprises further comprising a second dielectric layer vertically abutting the first dielectric layer between the holes, wherein the second dielectric layer extends into the holes and encapsulating each of the plurality of cylindrical cavities.

According to a further embodiment, the first dielectric layer comprises a dielectric material selected from the group consisting of a silicon oxide, a silicon nitride, a chemical vapor deposition (CVD) low-k dielectric material, and a spin-on low-k dielectric material.

According to an even further embodiment, the second dielectric layer comprises a dielectric material selected from the group consisting of a silicon oxide, a silicon nitride, and a chemical vapor deposition (CVD) low-k dielectric material.

According to a yet further embodiment, the first dielectric layer and the second dielectric layer comprise different materials.

According to a still further embodiment, the semiconductor structure further comprises a dielectric template layer vertically abutting the first dielectric layer and the second dielectric layer and having an opening over the plurality of cylindrical cavities.

According to a yet still further embodiment, the conductive material is a stack of a semiconductor material and a metal semiconductor alloy.

According to further another embodiment, the conductive material is a stack of polysilicon and a metal silicide.

According to another aspect of the present invention, a method of forming a semiconductor structure is provided, which comprises:

forming an electrical fuse comprising a first electrode, a second electrode, and a fuselink on shallow trench isolation in a semiconductor substrate;

forming a first dielectric layer on the electrical fuse;

forming a polymeric matrix comprising a first polymeric block component and containing cylindrical holes having a sublithographic diameter on the first dielectric layer;

forming a plurality of cylindrical holes having the sublithographic diameter in the first dielectric layer by etching the first dielectric layer; and depositing a second dielectric layer and forming a plurality of cylindrical cavities within the cylindrical holes, wherein the second dielectric layer extends into each of the cylindrical holes and encapsulates the cylindrical cavities.

According to one embodiment, the method further comprises:

applying a block copolymer on the first dielectric layer, wherein the block copolymer comprises at least the first polymeric block component and a second polymeric block component that are immiscible with each other;

annealing the block copolymer to form a plurality of cylindrical blocks comprising the second polymeric block component and having the sublithographic diameter and embedded in the polymeric matrix; and selectively removing the second polymeric block component relative to the polymeric matrix.

According to another embodiment, the method further comprises:

forming a dielectric template layer on the first dielectric layer; and forming an opening having lithographic dimensions in the dielectric template layer over the fuselink.

According to even another embodiment, the depositing of the second dielectric layer is a non-conformal process that deposits less material on a lower portion than on a top portion within each of the plurality of cylindrical holes and forms a conical cavity top.

According to yet another embodiment, the plurality of cylindrical cavities is separated from the fuselink by a sublithographic dimension.

According to still another embodiment, the method further comprises forming a dielectric spacer directly on sidewalls of the electrical fuse, wherein the plurality of cylindrical cavities is formed above the dielectric spacer and the shallow trench isolation and is separated from the dielectric spacer and the shallow trench isolation by portions of the second dielectric layer having a sublithographic thickness.

According to still yet another embodiment, the first dielectric layer comprises a first dielectric material selected from the group consisting of a silicon oxide, a silicon nitride, a chemical vapor deposition (CVD) low-k dielectric material, and a spin-on low-k dielectric material, and the second dielectric layer comprises a second dielectric material selected from the group consisting of a silicon oxide, a silicon nitride, and a chemical vapor deposition (CVD) low-k dielectric material.

According to a further embodiment, the sublithographic diameter is from about 10 nm to about 40 nm.

According to an even further embodiment, the block copolymer comprises the first and second polymeric block components, respectively, at a weight ratio of from about 80:20 to about 60:40.

According to a yet further embodiment, each of the plurality of cylindrical blocks has a substantially horizontal top surface and a substantially horizontal bottom surface.

According to a still further embodiment, the block copolymer is selected from the group consisting of polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA).

According to a still yet further embodiment, the block copolymer comprises PS-b-PMMA having a PS:PMMA weight ratio ranging from about 80:20 to about 60:40.

According to a further another embodiment, the annealing of the block copolymer comprises thermal annealing or ultraviolet treatment.

DETAILED DESCRIPTION OF THE INVENTION

Figure 1A:
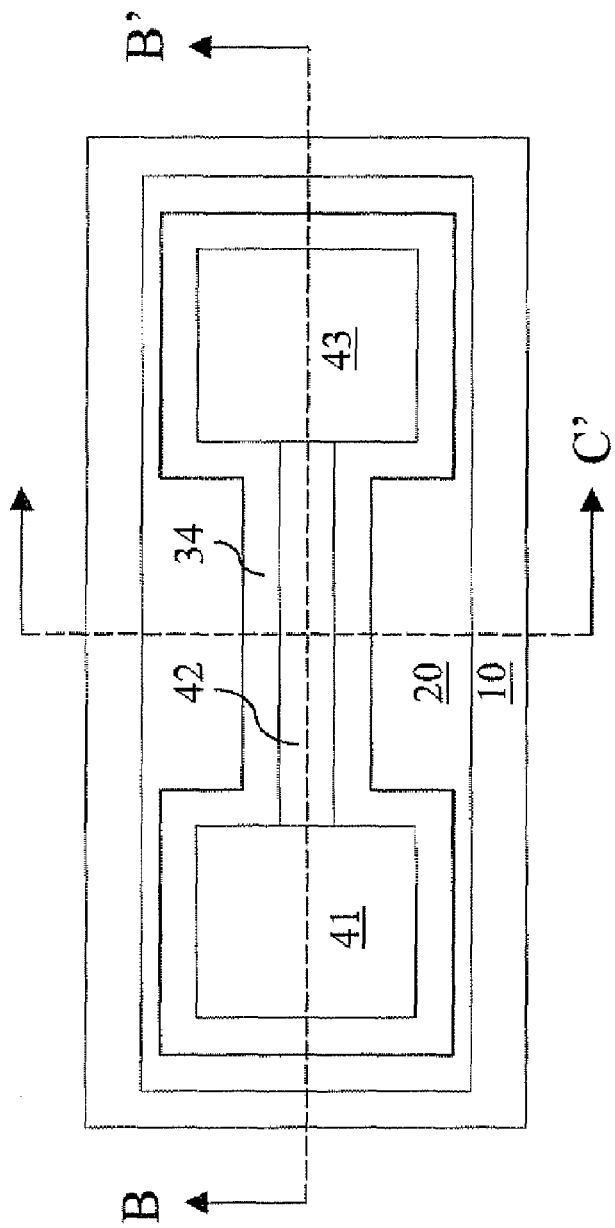
FIGS. 1A-7B are sequential views of a first exemplary structure according to a first embodiment of the present invention. Figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A."

As stated above, the present invention relates to an electrical fuse having sublithographic cavities upon a fuselink portion thereof and methods of manufacturing the same, which are now described in detail with accompanying figures. It is noted that like and corresponding elements are referred to by like reference numerals.

Figure 1B:
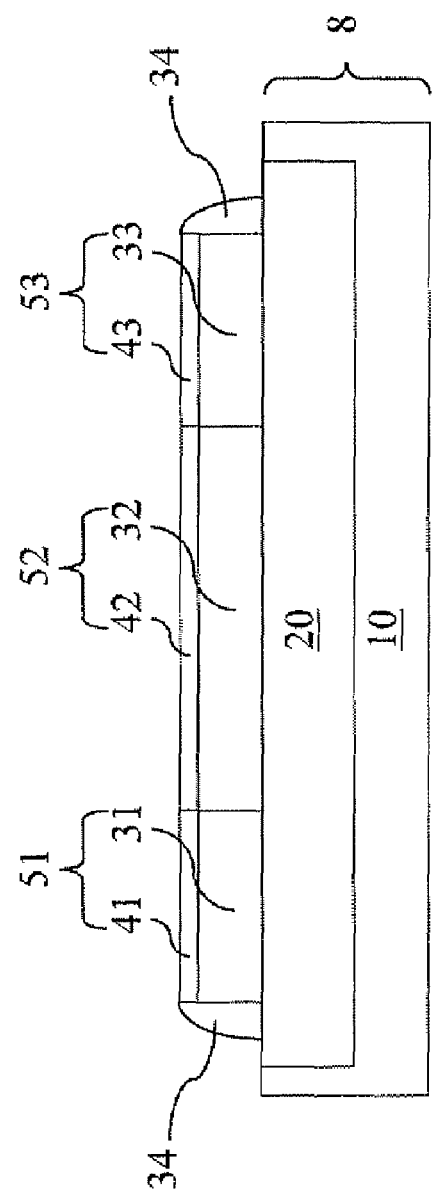

Referring to FIGS. 1A and 1B, a first exemplary structure according to the present invention comprises an electrical fuse formed on a semiconductor substrate 8 comprising a substrate layer 10 and shallow trench isolation 20. Preferably, the entirety of the electrical fuse is formed over the shallow trench isolation 20 and does not abut the substrate layer 10 to minimize heat loss during programming.

The electrical fuse comprises a first electrode 51, a second electrode 53, and a fuselink 52. Each of the first electrode 51, the second electrode 53, and the fuselink 52 comprises a conductive material that may be electromigrated. The conductive material may be a metal semiconductor alloy such as a metal silicide or a metal germanide, and/or a semiconductor material such as silicon, a silicon containing alloy, a germanium containing alloy, a III-V compound semiconductor, or a II-IV semiconductor. Preferably, the conductor material comprises a stack of a semiconductor material and a metal semiconductor alloy. For example, the conductor material may comprise a stack of polysilicon and a metal silicide. The polysilicon may, or may not, be doped. While the present invention is described for a case in which the conductor material comprises a stack of a semiconductor material and a metal semiconductor alloy, embodiments in which the conductive material consists of a semiconductor material or a metal semiconductor alloy are also contemplated herein.

During programming of the electrical fuse (51, 52, 53), a voltage bias is applied across the first electrode 51 and the second electrode 53. The electrode to which a relatively positive bias voltage is applied during the programming is typically called an "anode," while the other electrode to which a relatively negative voltage bias is applied is called a "cathode." Thus, one of the first electrode 51 and the second electrode 53 is the anode and the other is the cathode.

The first electrode 51 comprises a first electrode semiconductor portion 31 and a first electrode metal semiconductor alloy portion 41. Likewise, the second electrode 53 comprises a second electrode semiconductor portion 33 and a second electrode metal semiconductor alloy portion 43. The fuselink 52 comprises a fuselink semiconductor portion 32 and a fuselink metal semiconductor alloy portion 42.

The semiconductor substrate 8 may be a bulk substrate, a semiconductor-on-insulator (SOI) substrate, or a hybrid substrate. The semiconductor substrate 8 may have a built-in biaxial stress in the plane of the semiconductor substrate 8, i.e., in the plane perpendicular to the surface normal of the top surface of the semiconductor substrate 8. While the present invention is described with a bulk substrate, implementation of the present invention on an SOI substrate or on a hybrid substrate is explicitly contemplated herein.

The semiconductor substrate 8 is patterned for a shallow trench and filled with an insulator material. By planarizing and optionally recessing the insulator material, the shallow trench isolation 20 is formed in the semiconductor substrate 8. The portion of the semiconductor substrate containing a semiconductor material constitutes the substrate layer 10. The substrate layer 10 may comprise a semiconductor material such as amorphous silicon, epitaxial silicon, single crystal silicon, silicon germanium alloy, silicon carbon alloy, silicon carbon germanium alloy, a III-V compound semiconductor, or a II-VI compound semiconductor. The semiconductor material may be substantially undoped, doped with p-type dopants, or doped with n-type dopants.

The electrical fuse (51, 52, 53) is typically formed at the same time as a gate stack during processing steps of a semiconductor manufacturing sequence. The gate stack comprises a gate semiconductor material and a gate metal semiconductor alloy. While a different semiconductor material may be employed for the electrical fuse (51, 52, 53) than the gate semiconductor material, use of the same semiconducting material for both the gate semiconductor material and the electrical fuse (51, 52, 53) is in general preferred. Likewise, while a different metal semiconductor alloy material may be employed for the electrical fuse (51, 52, 53) than the gate metal semiconductor alloy, use of the same metal semiconductor alloy for both the gate metal semiconductor alloy and the electrical fuse (51, 52, 53) is in general preferred.

The first electrode semiconductor portion 31, the second electrode semiconductor portion 33, and the fuselink semiconductor portion 32 comprise a semiconductor material that may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material may be doped with electrical dopants, or undoped. The thickness of the various semiconductor portions (31, 32, 33) may be from about 10 nm to about 300 nm, and typically from about 50 nm to about 120 nm, although lesser and greater thicknesses are also contemplated herein. Different portions of the electrical fuse (51, 52, 53) may comprise semiconductor materials having different dopants.

Each of the first electrode metal semiconductor alloy portion 41, the second electrode metal semiconductor alloy portion 43, and the fuselink metal semiconductor alloy portion 42 comprises a metal semiconductor alloy. In case the first electrode semiconductor portion 31, the second electrode semiconductor portion 33, and the fuselink semiconductor portion 32 comprise silicon, the first electrode metal semiconductor alloy portion 41, the second electrode metal semiconductor alloy portion 44, and the fuselink metal semiconductor alloy portion 43 may comprise a metal silicide such as nickel silicide ($NiSi_x$), cobalt silicide ($CoSi_x$), tantalum silicide ($TaSi_x$), and titanium silicide ($TiSi_x$), tungsten silicide ($WSi_x$), platinum silicide ($PtSi_x$) or alloys thereof. The value of x is in general between 1 and 3. A metal nitride such as $TaN_x$, $TiN_x$, or $WN_x$ may be employed instead of a metal silicide as well.

A dielectric material is conformally deposited on sidewalls of the electrical fuse (51, 52, 53) and etched by a reactive ion etch to from a dielectric spacer 34. The dielectric spacer 34 abuts sidewalls of the electrical fuse (51, 52, 53), i.e., sidewalls of the first electrode 51, the second electrode 52, and the fuselink 52. The dielectric spacer 34 surrounds the electrical fuse (51, 52, 53) and is topologically homomorphic to a torus, i.e., may be continuously stretched and bent into a torus.

Figure 2A:
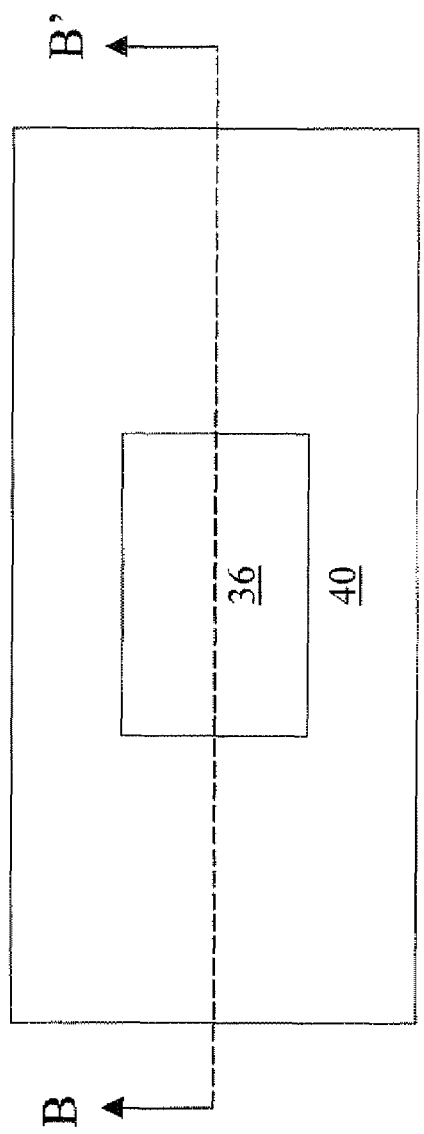
Figure 2B:
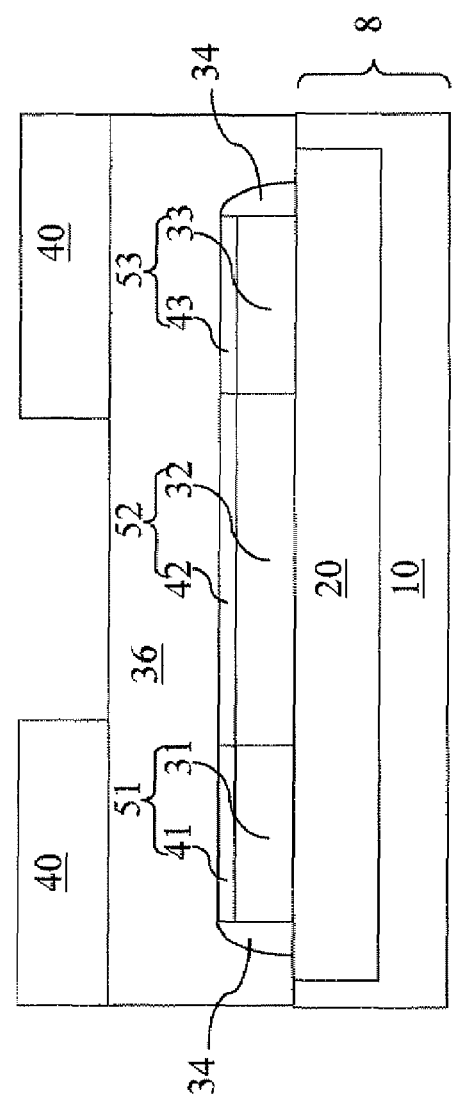

Referring to FIGS. 2A and 2B, a first dielectric layer 36 comprising a first dielectric material is formed on the electrical fuse (51, 52, 53). The first dielectric layer 36 abuts the top surfaces of the electrical fuse (51, 52, 53) and the sidewall of the dielectric spacer 34. The first dielectric material may comprise a silicon oxide, a silicon nitride, a chemical vapor deposition (CVD) low-k dielectric material, or a spin-on low-k dielectric material.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

The CVD low-k dielectric material may be a SiCOH dielectric containing a matrix of a hydrogenated oxidized silicon carbon material (SiCOH) comprising atoms of Si, C, O and H in a covalently bonded tri-dimensional network. The CVD low-k dielectric material can be porous or nonporous. Such CVD low-k dielectric material has a dielectric constant of not more than about 2.8 and typically comprises between about 5 and about 40 atomic percent of Si; between about 5 and about 45 atomic percent of C; between 0 and about 50 atomic percent of O; and between about 10 and about 55 atomic percent of H. The tri-bonded network may include a covalently bonded tri-dimensional ring structure comprising Si—O, Si—C, Si—H, C—H and C—C bonds. Further, the CVD low-k dielectric material may comprise F and N and may optionally have the Si atoms partially substituted by Ge atoms. The CVD low-k dielectric material may contain molecular scale voids (i.e., nanometer-sized pores) of between about 0.3 to about 50 nanometers in diameter, and most preferably between about 0.4 and about 10 nanometers in diameter, further reducing the dielectric constant of the first dielectric layer 36 to values below about 2.0.

The spin-on low-k dielectric material has a dielectric constant of about 3.0 or less, preferably less than about 2.8, and more preferably less than about 2.5. The spin-on low-k dielectric material can be porous or nonporous. An example of the spin-on low-k dielectric material is a thermosetting polyarylene ether, which is also commonly referred to as "Silicon Low-K", or "SiLK." The term "polyarylene" denotes aryl moieties or inertly substituted aryl moieties which are linked together by bonds, fused rings, or inert linking groups such as oxygen, sulfur, sulfone, sulfoxide, carbonyl, etc.

The first dielectric layer 36 may be self-planarizing as in the case of the spin-on low-k dielectric material, or may be planarized as needed. Typical thickness of the first dielectric layer 36 as measured from a top surface of the semiconductor substrate 8, i.e., from the interface between the shallow trench isolation and the electrical fuse (51, 52, 53), may be from about 200 nm to about 600 nm, and typically from about 300 nm to about 450 nm.

A dielectric template layer 40 is deposited on the first dielectric layer 40. The thickness of the dielectric template layer 40 may be from about 30 nm to about 300 nm, and typically from about 50 nm to about 200 nm. The dielectric template layer 40 may comprise a silicon oxide, a silicon nitride, or a stack thereof.

A photoresist (not shown) is applied on the dielectric template layer 40 and lithographically patterned to expose the portion of the dielectric template layer 40 over the fuselink 52. An opening having a lithographic dimension is patterned in the photoresist. The opening may be elliptical or rectangular. In case the opening is elliptical, the lengths of major axis and the minor axis of the ellipse are lithographic dimensions. The opening may be a circle, in which case the major and minor axes are the same and is a diameter of a circle. In case the opening is rectangular, the length and width of the rectangle are lithographic dimensions.

The pattern of the opening in the photoresist is transferred into the dielectric template layer 40 by a reactive ion etch. Thus, the dielectric template layer 40 contains an opening having a lithographic dimension located over the fuselink 52. The opening may be located above portions of the dielectric spacer 34 abutting the fuselink 52 and portions of the shallow trench isolation 20 adjacent to the dielectric spacer 34. In one case, the opening may be rectangular, and the width of the opening, or the dimension of the opening in the direction perpendicular to the direction from the first electrode 51 to the second electrode 53, may be less than the width of the fuselink, i.e., the dimension of the fuselink 52 in the direction perpendicular to the direction from the first electrode 51 to the second electrode 53, so that the rectangle overlaps a portion of the fuselink 52 but does not overlap the dielectric spacer 34 in a see-through top-down view. In another case, the width of the opening may be greater than the width of the fuselink 52 and less than the sum of the width of the fuselink 52 and twice the width of the dielectric spacer 34, so that the rectangle overlaps a portion of the fuselink 52 and portions of the dielectric spacer 34 in a see-through top-down view. In still another case, the width of the rectangle may be greater than the sum of the width of the fuselink 52 and twice the width of the dielectric spacer 34 so that the rectangle overlaps a portion of the fuselink 52, portions of the dielectric spacer 34, and portions of the shallow trench isolation 20 in a see-through top-down view.

Figure 3A:
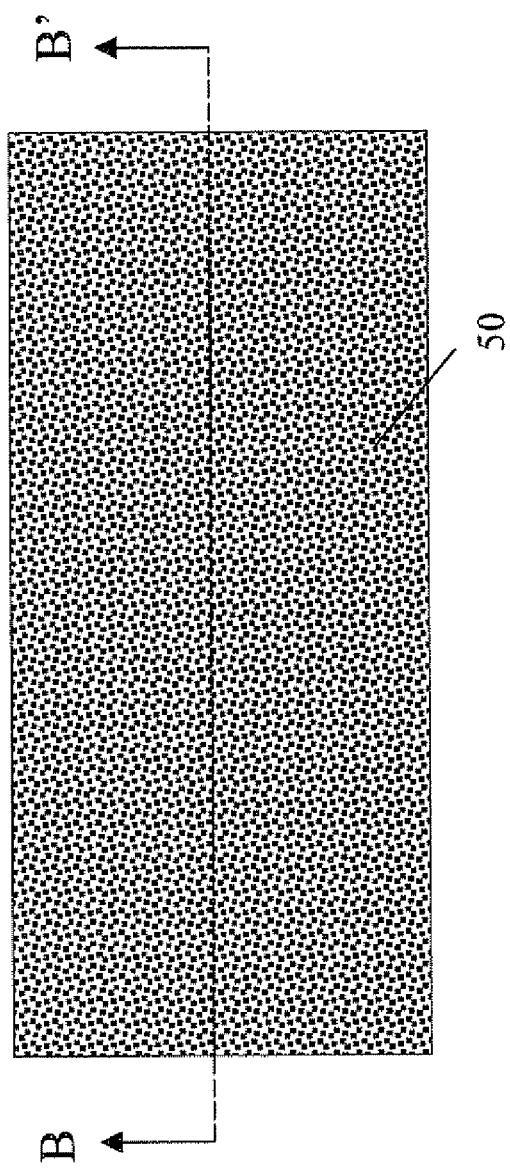
Figure 3B:
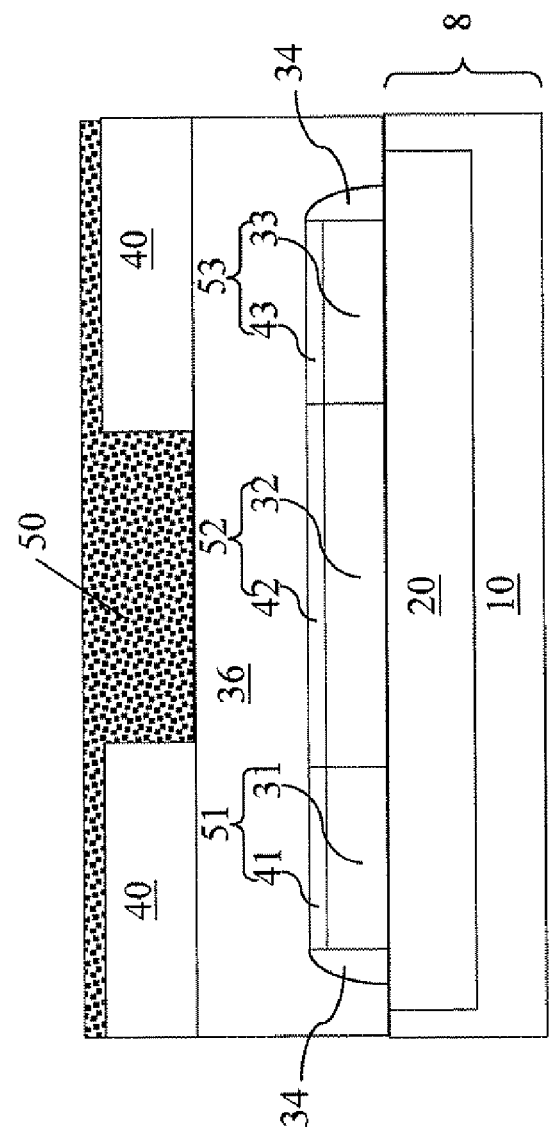

Referring to FIGS. 3A and 3B, a block copolymer mixture comprising self-assembling block copolymers that are capable of self-organizing into nanometer-scale patterns is applied over the first dielectric layer 36 within the opening in the dielectric template layer 40 to form a block copolymer layer 50. The block copolymer comprises at least a first polymeric block component and a second polymeric block component that are immiscible with each other. Under suitable conditions, the two or more immiscible polymeric block components separate into two or more different phases on a nanometer scale and thereby form ordered patterns of isolated nano-sized structural units. Such ordered patterns of isolated nano-sized structural units formed by the self-assembling block copolymers can be used for fabricating nano-scale structural units in semiconductor, optical, and magnetic devices. Specifically, dimensions of the structural units so formed are typically in the range of 10 to 40 nm, which are sub-lithographic (i.e., below the resolutions of the lithographic tools).

While a "lithographic minimum dimension" and a "sub-lithographic dimension" are defined only in relation to a lithography tool and normally changes from generation to generation of semiconductor technology, it is understood that the lithographic minimum dimension and the sublithographic dimension are to be defined in relation to the best performance of lithography tools available at the time of semiconductor manufacturing. As of 2007, the lithographic minimum dimension is about 50 nm and is expected to shrink in the future.

Exemplary materials for the block copolymer layer 50 are described in commonly-assigned, copending U.S. patent application Ser. No. 11/424,963, filed on Jun. 19, 2006, the contents of which are incorporated herein by reference. Specific examples of self-assembling block copolymers that can be used for forming the structural units of the present invention may include, but are not limited to: polystyrene-block-polymethylmethacrylate (PS-b-PMMA), polystyrene-block-polyisoprene (PS-b-PI), polystyrene-block-polybutadiene (PS-b-PBD), polystyrene-block-polyvinylpyridine (PS-b-PVP), polystyrene-block-polyethyleneoxide (PS-b-PEO), polystyrene-block-polyethylene (PS-b-PE), polystyrene-b-polyorganosilicate (PS-b-POS), polystyrene-block-polyferrocenyldimethylsilane (PS-b-PFS), polyethyleneoxide-block-polyisoprene (PEO-b-PI), polyethyleneoxide-block-polybutadiene (PEO-b-PBD), polyethyleneoxide-block-polymethylmethacrylate (PEO-b-PMMA), polyethyleneoxide-block-polyethylethylene (PEO-b-PEE), polybutadiene-block-polyvinylpyridine (PBD-b-PVP), and polyisoprene-block-polymethylmethacrylate (PI-b-PMMA). The self-assembling block copolymers are first dissolved in a suitable solvent system to form a block copolymer solution, which is then applied onto the surface of the first exemplary structure to form the block copolymer layer 50. The solvent system used for dissolving the block copolymer and forming the block copolymer solution may comprise any suitable solvent, including, but not limited to: toluene, propylene glycol monomethyl ether acetate (PGMEA), propylene glycol monomethyl ether (PGME), and acetone.

For example, the block copolymer may comprise the first and second polymeric block components, respectively, at a weight ratio of from about 80:20 to about 60:40. The block copolymer may comprise PS-b-PMMA having a PS:PMMA weight ratio ranging from about 80:20 to about 60:40.

Figure 4A:
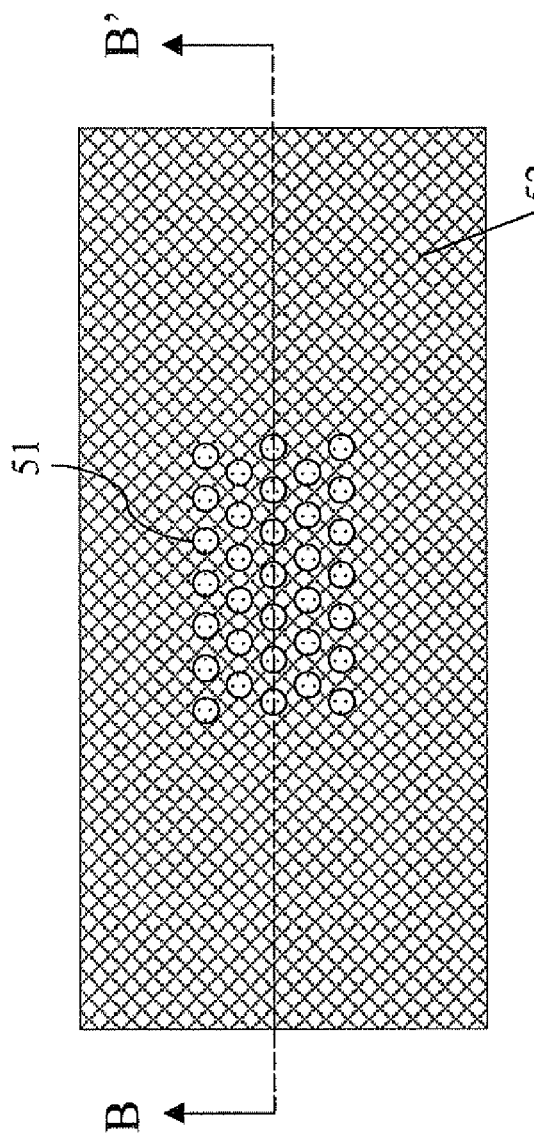
Figure 4B:
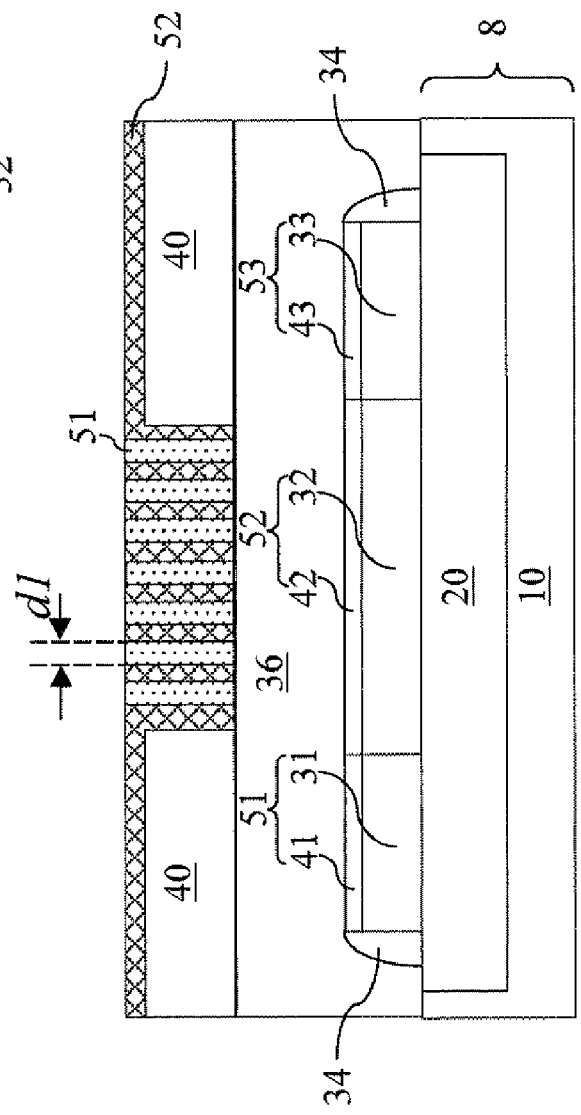

Referring to FIGS. 4A and 4B, the first exemplary semiconductor structure is annealed by ultraviolet treatment or by thermal annealing at an elevated temperature to form a plurality of cylindrical blocks 51 comprising the second polymeric block component, having a first sublithographic diameter d1, and embedded in the polymeric matrix 52 that comprises the first polymeric block component. Each of the plurality of cylindrical blocks 51 has a substantially horizontal top surface and a substantially horizontal bottom surface.

Exemplary processes of annealing the self-assembling block copolymers in the block copolymer layer 50 to form two sets of polymer blocks are described in Nealey et al., "Self-assembling resists for nanolithography," IEDM Technical Digest, December, 2005, Digital Object Identifier 10.1109/IEDM.2005.1609349, the contents of which are incorporated herein by reference. Further, methods of annealing described in the '963 application may be employed. The anneal may be performed, for example, at a temperature from about 200° C. to about 300° C. for a duration from less than about 1 hour to about 100 hours.

Figure 5A:
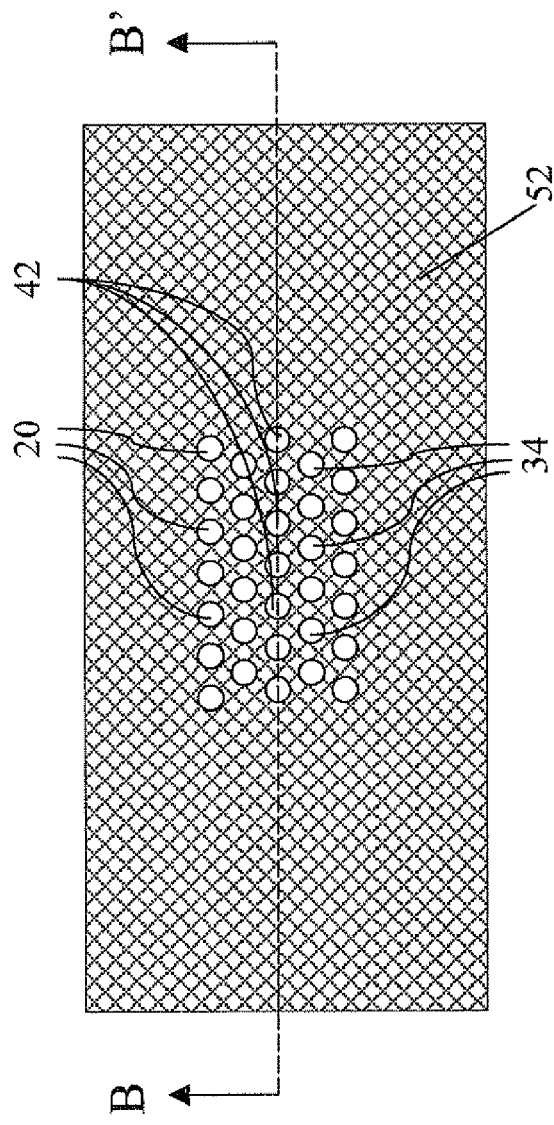
Figure 5B:
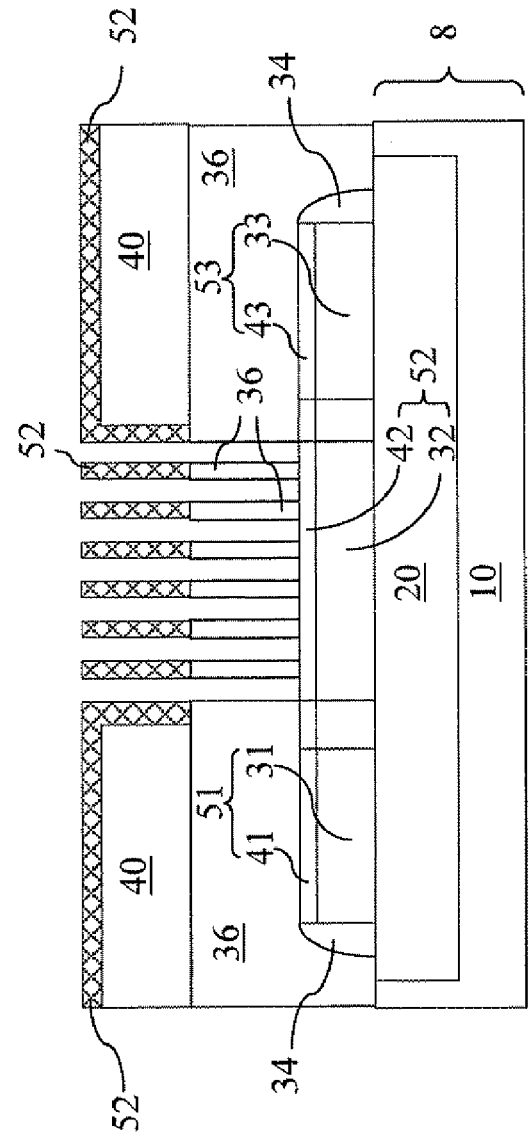

Referring to FIGS. 5A and 5B, the plurality of cylindrical blocks 51 comprising the second polymeric block component is selectively removing relative to the polymeric matrix 52 comprising the first polymeric block component. The polymeric matrix 52 has a honeycomb pattern, and contains cylindrical holes having the first sublithographic diameter d1.

The honeycomb pattern in the polymeric matrix 52 is then transferred into the first dielectric layer 36 by an anisotropic reactive ion etch that employs the polymeric matrix 52 as an etch mask. A plurality of cylindrical holes having the first sublithographic diameter d1 is formed in the first dielectric layer 36. Preferably, the anisotropic reactive ion etch is selective to the fuselink 52, the dielectric spacer 34, and the shallow trench isolation 20. In case the fuselink 52 comprises the fuselink metal semiconductor alloy 42, the anisotropic ion etch is selective to the fuselink metal semiconductor alloy 42.

Portions of the fuselink metal semiconductor alloy 42 are exposed at the bottom of some cylindrical holes. Depending on the dimensions of the opening in the dielectric template layer 40, portions of the dielectric spacer 34 may be exposed at the bottom of some other cylindrical holes. Depending on the dimensions of the opening in the dielectric template layer 40, portions of the shallow trench isolation 20 may be exposed at the bottom of still other cylindrical holes.

Figure 6A:
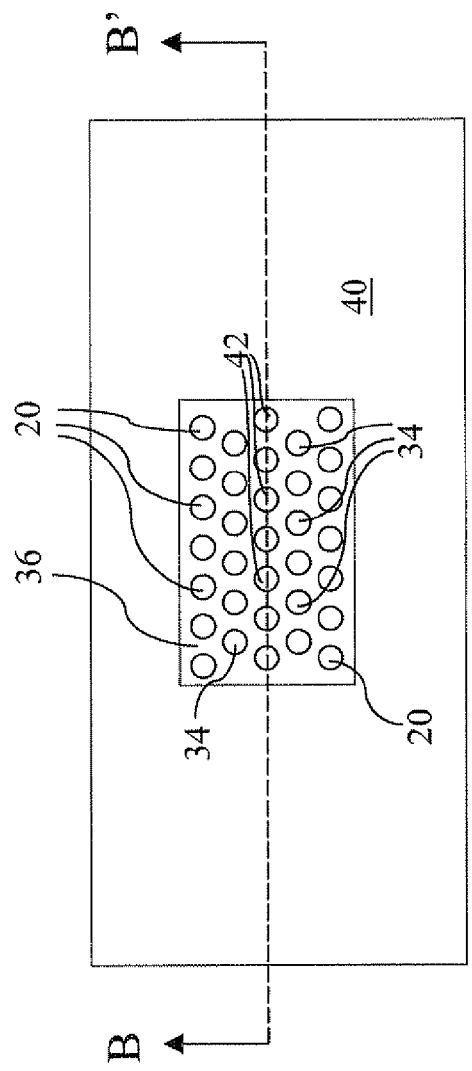
Figure 6B:
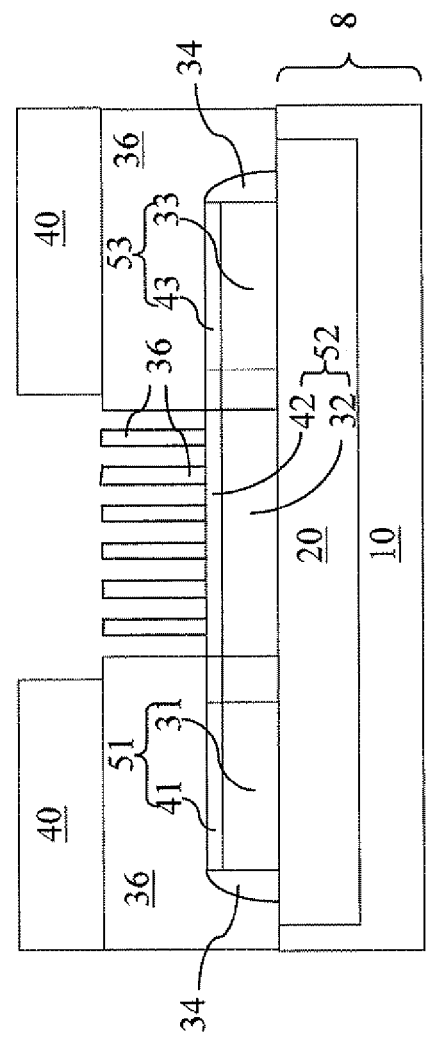

Referring to FIGS. 6A and 6B, the polymeric matrix 52 is removed, for example, by ashing or by a wet etch. The first dielectric layer 36 has a plurality of cylindrical holes having the first sublithographic diameter d1 and arranged in a honeycomb pattern above the fuselink 52. Since the diameter d1 of the plurality of cylindrical holes is sublithographic, e.g., less than 50 nm, while the height of the cylindrical holes in the first dielectric layer 36 is typically from about 150 nm to about 400 nm, the aspect ratio of each of the cylindrical holes in the first dielectric layer 36 is greater than 3, and typically from about 4 to about 30.

Figure 7A:
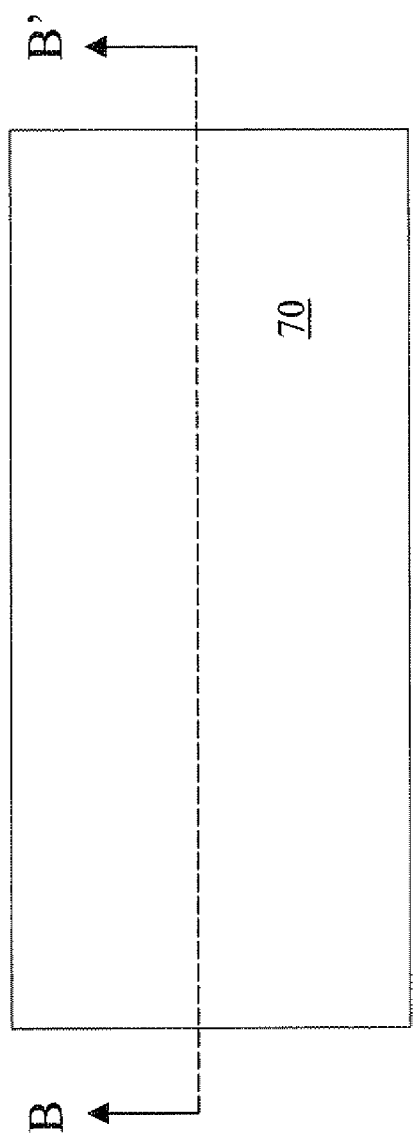
Figure 7B:
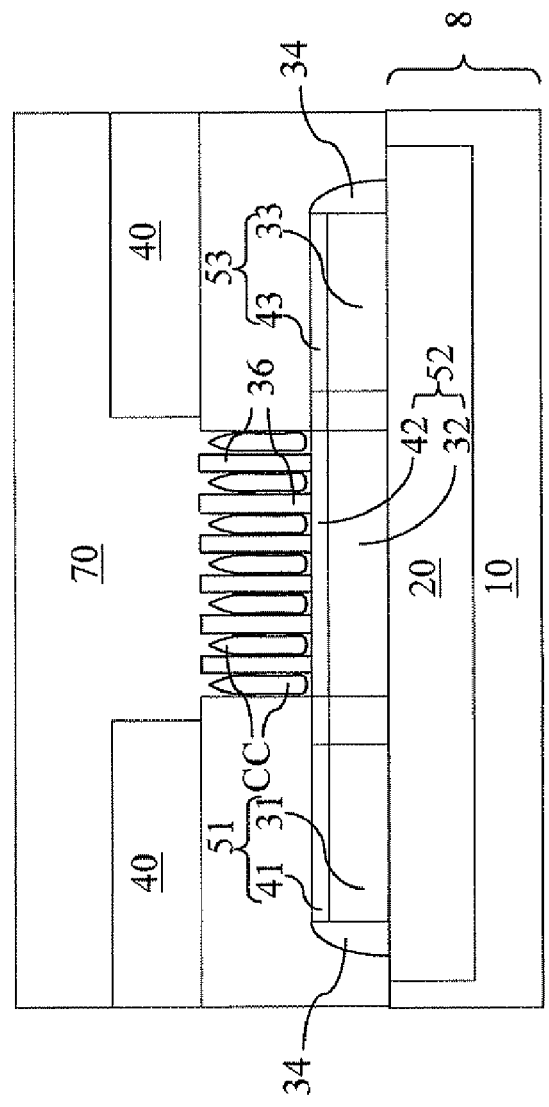

Referring to FIGS. 7A and 7B, a second dielectric layer 70 is deposited on the first dielectric layer 36. The second dielectric layer 70 may comprise a silicon oxide, a silicon nitride, or a chemical vapor deposition (CVD) low-k dielectric material.

Exemplary materials for the silicon oxide, the silicon nitride, and the CVD low-k dielectric material are as described above.

The second dielectric layer 70 is deposited by a non-conformal deposition, i.e., the deposition process is depletive and mass flow limited. The second dielectric material may, or may not be, the same material as the first dielectric material. Sine each of the cylindrical holes in the first dielectric layer 36 has a high aspect ratio, only a thin layer of second dielectric material is deposited on the sidewalls and bottom surfaces of the cylindrical holes in the first dielectric layer 36, while the top surface of the first dielectric layer 36 accumulates a second dielectric material to cover the cylindrical holes in the first dielectric layer 36. Cylindrical cavities CC that are encapsulated, i.e., completely surrounded without any opening, by the second dielectric material is formed within each of the plurality of cylindrical holes in the first dielectric layer 36. The second dielectric material extends into each of the cylindrical holes within the first dielectric layer 36 and encapsulates each of the cylindrical cavities. The diameter of the cylindrical cavities, defined as an average diameter of substantially cylindrical portion of the cylindrical cavities CC, is a second sublithographic diameter d2, which is less than the first sublithographic diameter d1. The cylindrical cavities CC are sublithographic cylindrical cavities, i.e., cylindrical cavities having a sublithographic dimension, which is the second sublithographic diameter d2.

Near the top of the cylindrical holes in the first dielectric layer 36, the thickness of the second dielectric material on the sidewalls of the cylindrical holes increases with height until the cylindrical cavities narrow down to a point. The top portion of each of the cylindrical cavities has a substantially conical shape, i.e., each of the cylindrical cavities has a cylindrical conical top portion. The apex of each of the cylindrical cavities coincides with the center of a cross-sectional area of the cylindrical cavity CC as seen in a see-through top-down view.

Figure 8:
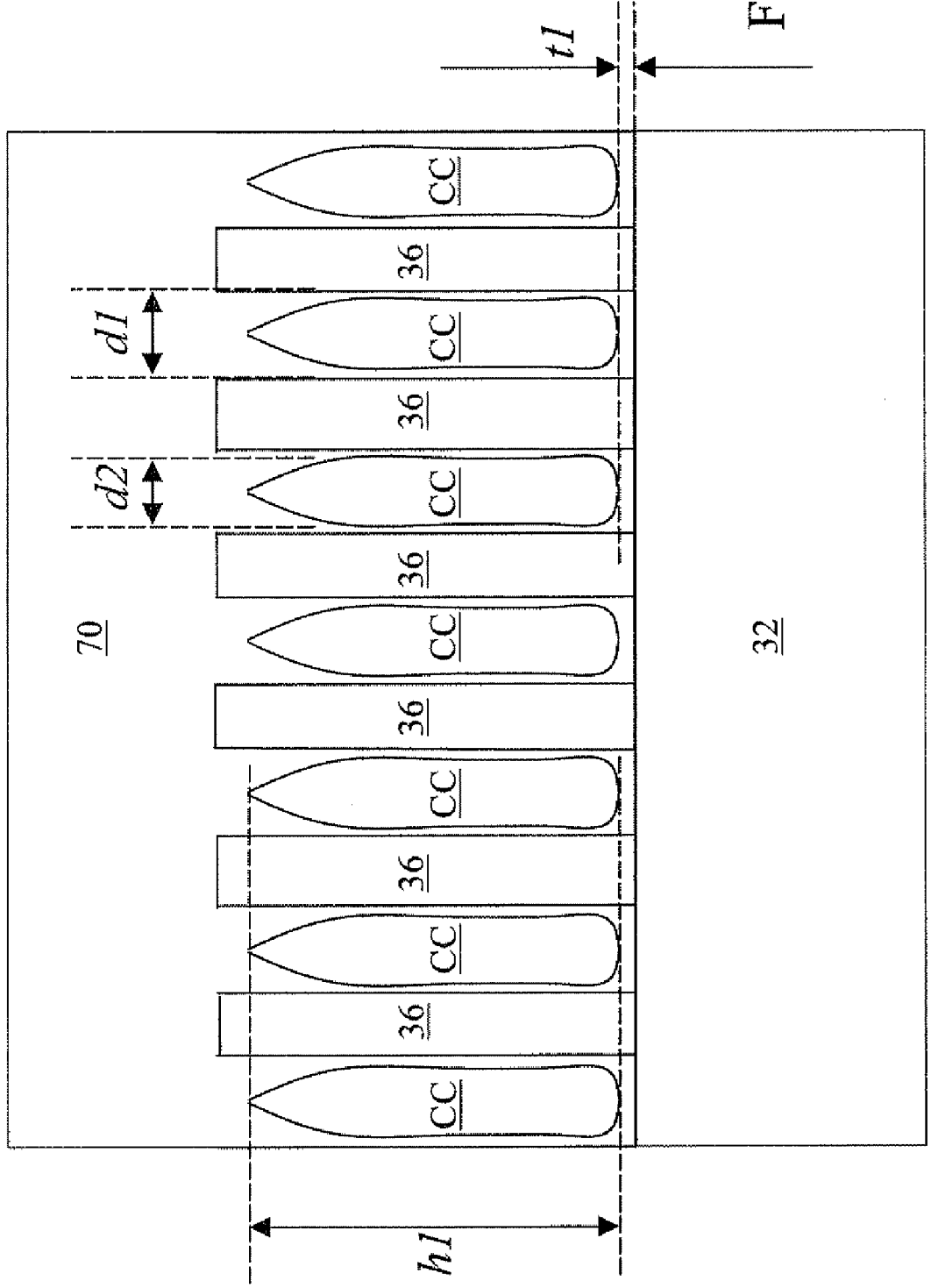
FIG. 8 is a magnified view of a plurality of cylindrical cavities in FIG. 7A.

Referring to FIG. 8, a magnified view of the vertical cross-sectional view of FIG. 7A is shown. Due to the non-conformal nature of the deposition process for the second dielectric layer 70, the thickness t1 of the second dielectric material between the fuselink metal semiconductor alloy 32 and each of the cylindrical cavities CC is sublithographic. The thickness t1 may be typically from about 0.5 nm to about 10 nm. The first sublithographic diameter d1 may be typically from about 10 nm to about 40 nm. The difference between the first sublithographic diameter d1 and the second sublithographic diameter d2 may be from about 0.5 nm to about 10 nm.

The plurality of cylindrical cavities CC provides enhanced thermal insulation to the fuselink 52 than any dielectric material since virtually no heat flows through the cylindrical cavities by conduction. Thus, the fuselink 52 is better thermally insulated from surrounding structures and capable of maintaining a higher temperature during programming of the electrical fuse (51, 52, 53). A more reliable programming may be performed at a higher temperature than conventional electrical fuses employing thermal insulation by a dielectric material without cavities. Alternatively, a smaller programming current may be supplied from a smaller programming transistor so that the temperature during programming is comparable with the temperature during programming of a conventional electrical fuse that does not have a cavity thereupon. The smaller programming transistor has a less footprint than a conventional programming transistor.

In addition, the thin portion of the second dielectric material located directly above the fuselink 52 and having the thickness t1 may be easily broken to relieve pressure in the fuselink 52 that may build up during electromigration. Thus, the cylindrical cavities CC serve as a reservoir of volume into which an electromigrated material from the fuselink 52 may flow during programming of the electrical fuse (51, 52, 53) to relieve pressure during the electromigration process, thus facilitating the electromigration of the material in the fuselink 52.

Figure 9A:
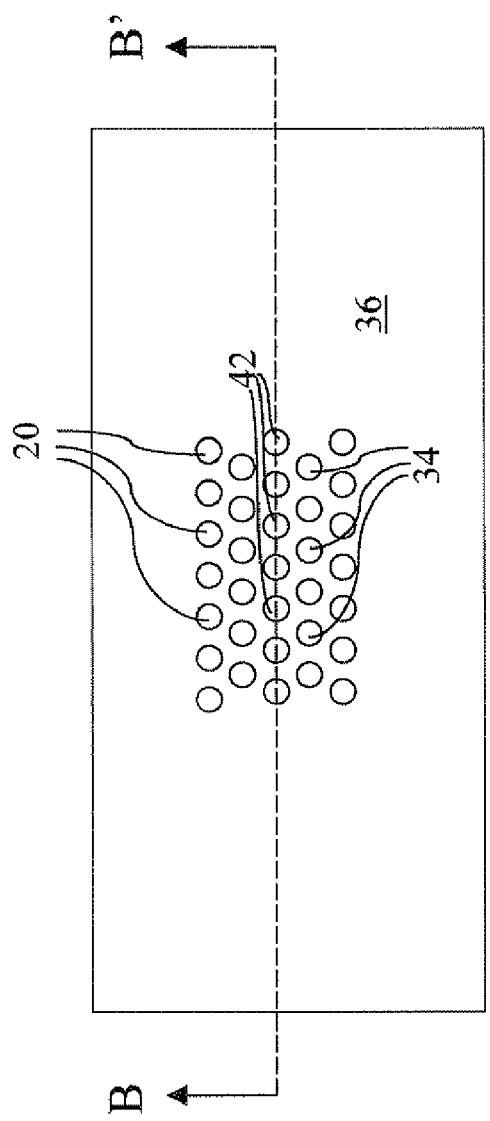
FIGS. 9A-10B are sequential views of a second exemplary structure according to a second embodiment of the present invention. Figures with the same numeric label correspond to the same stage of manufacturing; figures with the suffix "A" are top-down views; figures with the suffix "B" are vertical cross-sectional views along the plane B-B' of the corresponding figure with the same numeric label and the suffix "A."
Figure 9B:
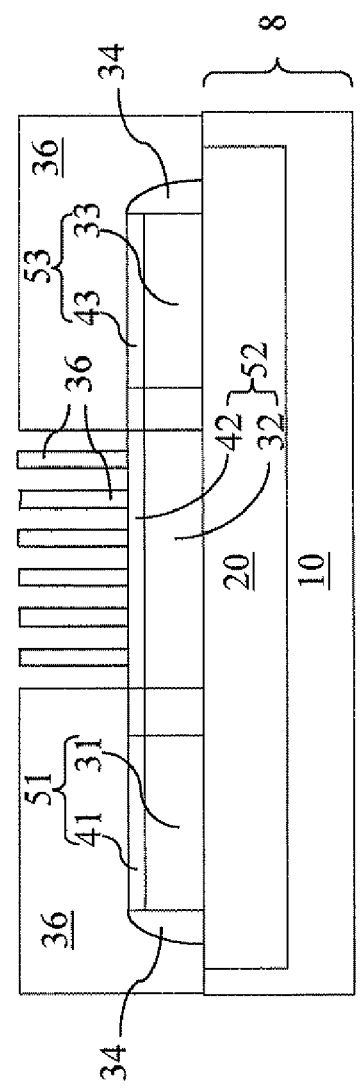

Referring to FIGS. 9A and 9B, a second exemplary structure according to a second embodiment of the present invention is derived from the first exemplary structure shown in FIGS. 6A and 6B by removing the template dielectric layer 40 selective to the first dielectric layer 36. In the second embodiment, the template dielectric layer 40 comprises a different material than the first dielectric layer 36. A reactive ion etch or a wet etch process that etches the template dielectric material layer 40 selective to the first dielectric layer 36 may be employed.

Figure 10A:
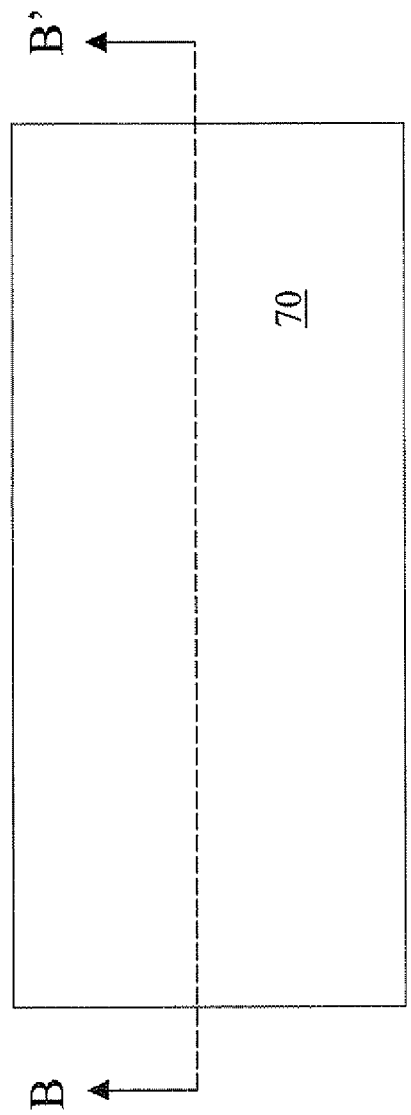
Figure 10B:
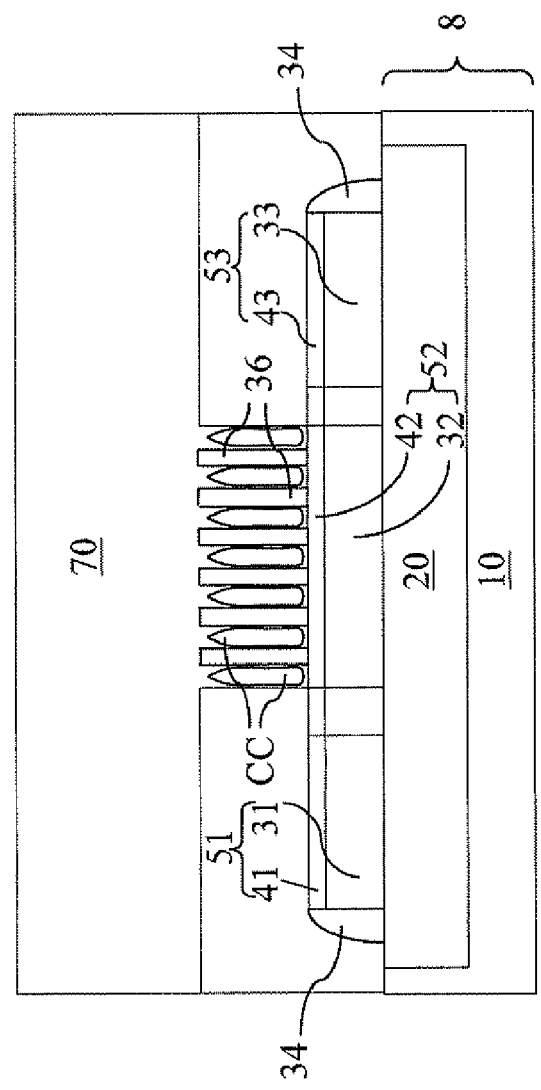

Referring to FIGS. 10A and 10B, a second dielectric layer is deposited on the first dielectric layer as in the processing step corresponding to FIGS. 7A and 7B in the first embodiment. The same second dielectric material and the same process may be employed as in the first embodiment to form the cylindrical cavities CC having the same structural characteristics as in the first embodiment. However, the second exemplary semiconductor structure does not contain a template dielectric layer.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
    an electrical fuse comprising a first electrode, a second electrode, and a fuselink, and located on shallow trench isolation in a semiconductor substrate, wherein each of said first electrode, said second electrode, and said fuselink comprises a conductive material; and
    a plurality of cylindrical cavities located above said fuselink.

2. The semiconductor structure of claim 1, wherein said plurality of cylindrical cavities has a sublithographic diameter, and is separated from said fuselink by a sublithographic dimension.

3. The semiconductor structure of claim 2, further comprising a dielectric spacer abutting outer sidewalls of said first electrode, said second electrode, and said fuselink, wherein said plurality of cylindrical holes are located above said dielectric spacer and said shallow trench isolation.

4. The semiconductor structure of claim 3, wherein said plurality of cylindrical cavities is separated from said dielectric spacer and said shallow trench isolation by said sublithographic dimension.

5. The semiconductor structure of claim 1, wherein each of said plurality of cylindrical cavities has a cylindrical conical top portion.

6. The semiconductor structure of claim 1, wherein said plurality of cylindrical cavities is separated from one another by a first dielectric layer having holes arranged in a honeycomb pattern, wherein said plurality of cylindrical cavities are located within said holes.

7. The semiconductor structure of claim 6, further comprising a second dielectric layer vertically abutting said first dielectric layer between said holes, wherein said second dielectric layer extends into said holes and encapsulating each of said plurality of cylindrical cavities.

8. The semiconductor structure of claim 7, wherein said first dielectric layer comprises a dielectric material selected from the group consisting of a silicon oxide, a silicon nitride, a chemical vapor deposition (CVD) low-k dielectric material, and a spin-on low-k dielectric material.

9. The semiconductor structure of claim 7, wherein said second dielectric layer comprises a dielectric material selected from the group consisting of a silicon oxide, a silicon nitride, and a chemical vapor deposition (CVD) low-k dielectric material.

10. The semiconductor structure of claim 7, wherein said first dielectric layer and said second dielectric layer comprise different materials.

11. The semiconductor structure of claim 7, further comprising a dielectric template layer vertically abutting said first dielectric layer and said second dielectric layer, and having an opening over said plurality of cylindrical cavities.

12. The semiconductor structure of claim 1, wherein said conductive material is a stack of a semiconductor material and a metal semiconductor alloy.

13. The semiconductor structure of claim 12, wherein said conductive material is a stack of polysilicon and a metal silicide.

* * * * *